United States Patent [19]
Phillips et al.

[11] 3,993,935
[45] Nov. 23, 1976

[54] PRINTED CIRCUIT BOARD CONNECTION

[75] Inventors: Lewis A. Phillips, Rockville; George J. Leiby, Mount Airy, both of Md.

[73] Assignee: Xerox Corporation, Stamford, Conn.

[22] Filed: Dec. 16, 1974

[21] Appl. No.: 533,396

[52] U.S. Cl. ............................................. 317/101 C
[51] Int. Cl.² ........................................... H05K 1/04
[58] Field of Search ............... 339/14 R, 14 P, 111, 339/776 MP; 317/101 B, 101 C, 101 DH

[56] References Cited
UNITED STATES PATENTS

| | | | |
|---|---|---|---|
| 3,149,893 | 9/1964 | Dupre | 339/14 R |
| 3,191,095 | 6/1965 | Hefti | 317/101 DH |
| 3,278,714 | 10/1966 | Bernutz | 339/176 MP |
| 3,399,372 | 8/1968 | Uberbacher | 339/14 R |
| 3,691,399 | 9/1972 | Vinch et al. | 317/101 DH |

*Primary Examiner*—David Smith, Jr.

[57] ABSTRACT

A printed circuit board or the like for electrical apparatus has edge connectors for insertion into a terminal or group of terminals for communication of electrical signals from the terminals to the board and vice versa. Some contacts on the board edge are recessed slightly from the edge so that certain electrical connections may be made prior to others.

1 Claim, 2 Drawing Figures

PRINTED CIRCUIT BOARD CONNECTION

BACKGROUND OF THE INVENTION

1. Field of the Invention

This invention relates to module boards, and more particularly to providing module board connection means such that a board may be inserted into or removed from its receptical without interfering with the operation of other boards connected in the same circuit.

2. Description of the Prior Art

In many electronic devices, circuit boards are utilized to carry components and sub-assemblies of electronic circuits. In some electronics applications, for example in the field of digital computers, redundant or parallel-connected circuits may be used to aid in maintaining reliability or providing ease of maintenance of the devices. In such applications, it is frequently desirable to provide the facility for removing certain of the circuit boards while the device is in operation without disturbing the operation of the remainder of the boards.

SUMMARY OF THE INVENTION

In order to provide for removal and insertion of circuit boards during operation of the device of which the board is a component, the instant invention provides recessed contacts in certain critical board edge connection functions such as to allow stabilization of the board elements and signals before electrical contact is made to the particularly critical circuit element.

DESCRIPTION OF THE PREFERRED EMBODIMENT

Figure 1:
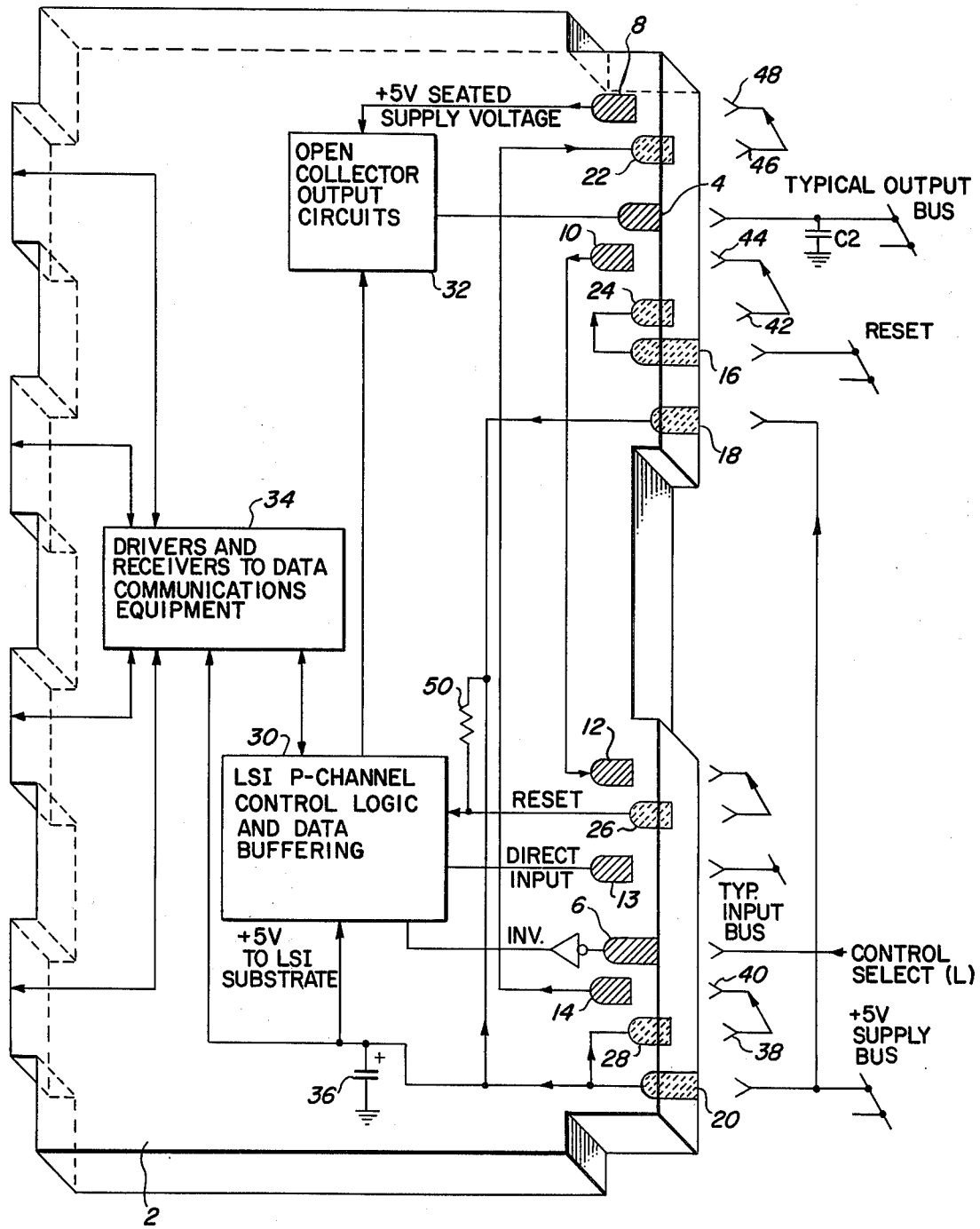
FIG. 1 is a partially pictorial, partially schematic representation of a printed circuit board according to the instant invention.

FIG. 1 shows a partially pictorial, partially schematic diagram of a printed circuit board according to the instant invention, which board may form a portion of a data communications device. In FIG. 1, a printed circuit board, in this case a two-sided printed circuit board, is shown generally at 2. On the right hand side of the Printed CCircuit Board 2 are shown Connector Tabs 4, 6, 8, 10, 12, 13, and 14 which are used in conjunction with socket pins shown schematically, to apply voltages and/or electrical signals to or from the board and the components mounted thereon. It should be noted that Connector Tabs 4 and 6 extend to the very edge of the printed circuit board while Connector Tabs 8, 10, 12, 13, and 14 are slightly recessed from the edge of the board. Since the board represented is a two-sided board, that is, signals and/or voltages may be applied to either side of the printed circuit board, a further set of Terminals 22, 24, 16, 18, 20, 26, and 28 are provided, of which Terminals 16, 18 and 20 extend to the edge of the board and 22, 24, 26, and 28 are slightly recessed on the opposite side of the board.

A number of additional terminals and contacts may be provided on a typical board, for grounding and for other signals and voltages, but these are not shown in this pictorial/schematic diagram for purposes of clarity of description.

Mounted on the board are several integrated circuit devices including an LSI P-Channel Control Logic and Data Buffering Device 30, open collector output circuits (such as integrated curcuit type 32, and integrated circuits containing drivers and receivers which may be, for example, interconnected to other data communications equipment and are represented at 34.

The LSI P-Channel Circuit 30 may use a technique for interfacing with TTL logic both from on and off the board. This technique may require that the LSI substrate be connected to a plus 5 volt supply. Until the plus 5 volt supply on the board has made connection to the plus 5 volt supply bus, a Capacitor 36 will be discharged and the substrate of the LSI Circuit 30 will be held near ground potential. Since bus signals which must connect directly to the LSI Module 30 go positive to about plus 3.5 volts, FET junctions in the LSI would be forward biased and load the input bus for each connection. The loading could be excessive and interfere with signals to other boards. Direct inputs to the LSI Module 30 are thus delayed via the Recess Contact 13 until after the plus 5 volts is applied by means of an unrecessed contact 20 to plus 5 volts through Contacts 20 and 18.

Shown to the right of the Printed Circuit Board 2 are schematic representations of bus and signals terminals to be applied to the board. For example, the plus 5 volt supply bus is shown for connection with Contacts 20 and 18 on the board. A reset bus is shown with a contact for connection to contact 16 and an output bus is shown with a connector for contact with the Contact 4 on the board. Additionally, jumper contacts are provided for the recessed terminals on the board and are shown at 38, 40 for connection to Tabs 14 and 28, respectively, a Jumper 42, 44 for connection to recessed Tabs 10 and 24, and a Jumper 46, 48 for connection to recessed Tabs 8 and 22, respectively. As can be seen, these jumpers are provided to allow connection between the pairs of tabs of which each is associated.

Output bus signals share output bus lines from other channel boards. The open Collector Output Circuits 32 which drive these bus lines are disabled until the series circuit through jumpers 46, 48 and 38, 40 connects the plus 5 supply volts to them. When the module first starts entering the connector, the Reset Line which normalizes all controls in the LSI 30 is driven high (Reset true) by a Biasing Resistor 50 connected to plus 5 volts. Only after all the logic has settled into a quiescent state during module insertion will the plus 5 volt supply bus be connected to the output driver circuits. It should be noted that, because associated jumper connectors are located on opposite ends of the Printed Circuit Board 2, that an insertion in a skewed manner will not allow the connection of the plus 5 volt supply until the board is properly seated fully in the connector block.

A series circuit through Connections 42, 44 and 12, 26 must connect the Reset bus to the Reset Line on the board to ground out the positive biasing from Resistor 50 before any operation can begin.

After the board reaches the bottom of the connector socket, and all contacts are made, the board may receive control signals. The input Control Module Select (L) is held high when none of the channels on the module are selected to receive control signals to begin operation. During board insertion this signal would be held high (unselected) until the installer knows that the board is seated sufficiently to be sure all recessed contacts can accept control codes correctly.

As previously noted, there are many ground contacts not shown in the sketch, and at least two plus 5 volt supply contact (18 and 20) arranged with a minimum of one plus 5 volt and one ground along the top and bottom halves of the board edge. These contacts are not recessed enabling connection to both ground and the plus 5 volt supply before connection is made to any of the recessed contact used for direct input to the LSI. The sequence is equally maintained using typical manufacturing tolerances, and the resulting skew allowance during insertion. Capacitor C2 limits transients caused by the connection of the output bus to the output circuit which has a finite capacitance to be charged from the bus during the connection.

Figure 2:
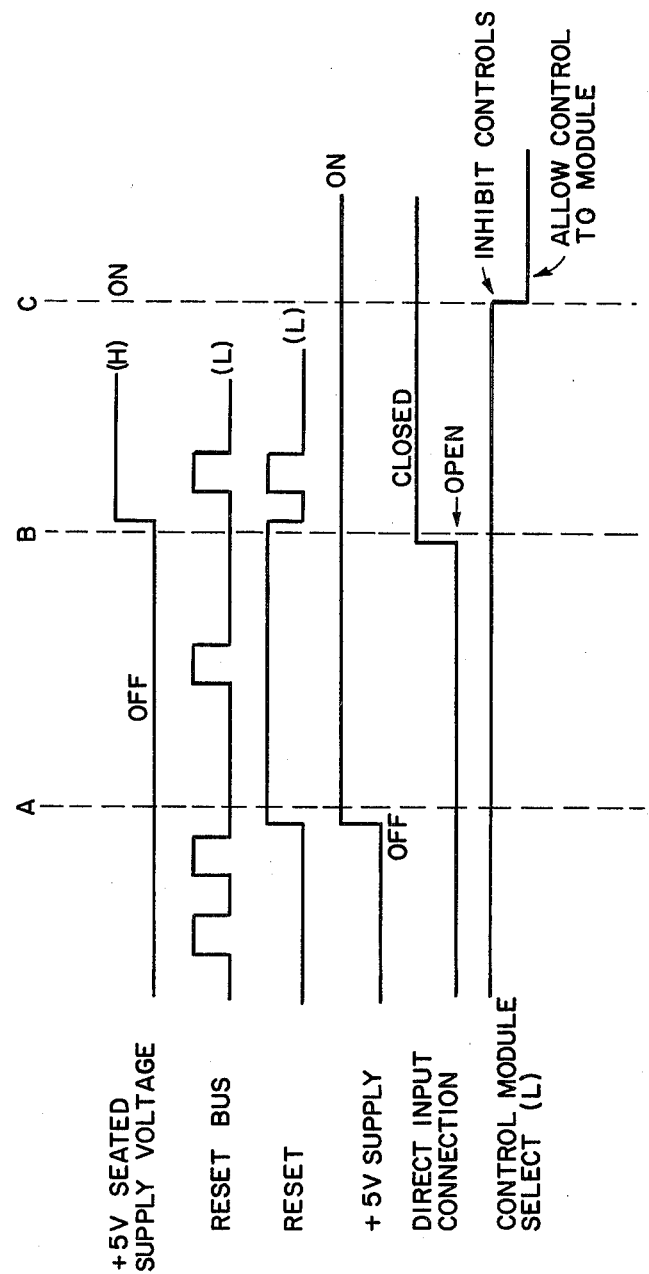
FIG. 2 is a timing diagram representing signal and voltage connections as a function of time for a typical application of the invention.

FIG. 2 is a timing diagram showing the relationship among voltages and signals provided to and from the Printed Circuit Board 2. As the board insertion sequence is begun, the Reset bus produces Reset pulses from the remaining portions of the communications system of which this board is a part. The Reset Line, the plus 5 volt supply and the control module select (L) may all be high as generated by other modules not shown. As the board makes initial contact, at A, and the Reset plus 5 volt supplies together with the Control Module Select (L) are all applied to the devices on the printed circuit board. As the board becomes fully seated at B, the plus 5 volts seated supply voltage may be applied to the open collector output Circuits 32. The Reset will also be applied to the LSI P-Channel Module 30 as a result of the recessed Contact 10, 24, 12 and 26. As previously noted, the plus 5 volt supply has been immediately established in connection with the LSI P-Channel 30 as a result of the non-recessed Contacts 18 and 20. The direct input connection via recessed Terminal 13 may then be applied to the LSI P-Channel Module 30 and when the Control Module Select Line (L) goes low, full control is given to the module at C on the timing diagram. The module is, at this point, prepared to assume full operation.

In summary, when a module board is inserted in a receptacal, and is being pushed toward the bottom, an arrangement of single and multiple contacts, some of them recessed, determine a sequence of connections to eliminate interference with other parallel channels of the device which may be in operation.

While the present invention has been described with reference to a preferred arrangement thereof, it will be understood to those skilled in the art that various changes may be made without departing from the true spirit and scope of the invention as set forth in the appended claims.

What is claimed is:

1. A printed circuit board having electrical components thereon, means for applying electrical signals to said board and for extracting electrical signals from said board said means comprising:
    a. a plurality of terminal connectors along at least one edge of said board,
    b. at least one of said terminal connectors recessed from the edge of said board,
    c. at least one of said terminal connectors extending to the edge of said board,
    d. a connector receptacle for receiving said edge of said board and said terminal connectors, whereby said terminal connector extending to the edge of said board makes contact with said connector receptacle prior to contact between said connector receptacle and said recessed terminal connector, and
    e. a signal path extending from said receptacle at one end of said board edge, onto said board and along said board to the opposite end thereof and through a recessed terminal connector to said receptacle to prevent signal connection when the board is inserted into the receptacle in a skewed manner.

* * * * *